United States Patent [19]

Liu

[11] Patent Number: 5,081,460
[45] Date of Patent: Jan. 14, 1992

[54] METHOD AND APPARATUS FOR TESTING PHASE SHIFTER MODULES OF A PHASED ARRAY ANTENNA

[75] Inventor: Sien-Chang C. Liu, Brea, Calif.

[73] Assignee: Hughes Aircraft Company, Los Angeles, Calif.

[21] Appl. No.: 643,968

[22] Filed: Jan. 22, 1991

[51] Int. Cl.[5] .............................. G01S 7/40
[52] U.S. Cl. ................... 342/169; 342/170; 342/371
[58] Field of Search ............ 342/169, 170, 368, 369, 342/370, 371, 372, 373, 375, 376, 377

[56] References Cited

U.S. PATENT DOCUMENTS

| | | | |
|---|---|---|---|
| 4,453,164 | 6/1984 | Patton | 342/169 |
| 4,520,361 | 5/1985 | Frazita | 342/372 |
| 4,532,518 | 7/1985 | Gaglione et al. | 342/372 |
| 5,003,314 | 3/1991 | Berkowitz et al. | 342/372 |

Primary Examiner—Mark Hellner
Attorney, Agent, or Firm—W. K. Denson-Low

[57] ABSTRACT

Faulty subarray module circuit boards are detected in a phased array antenna having many subarray module circuit boards while the antenna is fully assembled and operationally integrated with a radar system. A far field ratio frequency test source illuminates the antenna. Binary digital signals that control subarray steering bits are set to a reference setting. A particular subarray module circuit board that is under test has its 180° main phase bit toggled between 0° and 180°. The radar selects the output of that particular subarray module by Doppler filter type of software filtering. The amplitude of the in-phase and quadrature phase signals from the radar is recorded. The binary digital signals that control subarray steering bits are set to a second setting. The 180° main phase bit of the module under test is again toggle between 0° and 180°. The output of the module under test is again selected by Doppler filter type of software filtering. The amplitude of the in-phase and quadrature phase signals from the radar is recorded. The phase difference from the reference setting to the second setting is computed and compared with a predetermined threshold. If desired, the test source may have a multi-element feed including multiple dipoles, each dipole having a radiation pattern wide enough to cover two rows of subarray modules, the test source being switched to the particular one of the dipoles that illuminates the row including the module under test.

14 Claims, 3 Drawing Sheets

| SUBARRAY STEERING BITS | | | DIPOLE NUMBER | | | | | |
|---|---|---|---|---|---|---|---|---|
| CONTROL TERMINAL NO. | | | 11 | 12 | 13 | 14 | 15 | 16 |
| 53 | 52 | 51 | | | | | | |
| STATE | 0 | 0 | 0 | 0° | -20° | -27.5° | -47.5° | -42.5° | -62.5° |
| STATE | 0 | 0 | 1 | 0° | -20° | -52.5° | -72.5° | -42.5° | -62.5° |
| STATE | 0 | 1 | 0 | 0° | -20° | -27.5° | -47.5° | -67.5° | -87.5° |
| STATE | 1 | 0 | 0 | 0° | -20° | -27.5° | -47.5° | -92.5° | -112.5° |

| SUBARRAY STEERING BITS | | | AMPLITUDE AND PHASE OF THE COMBINED SIGNAL RF TERMINAL 40 | PHASE SHIFT (STATE 0 IS REFERENCE) |
|---|---|---|---|---|
| 53 | 52 | 51 | | |
| STATE | 0 | 0 | 0 | 5.63 ∠-33.4 | 0° |
| STATE | 0 | 0 | 1 | 5.45 ∠-42.0 | -8.6° |
| STATE | 0 | 1 | 0 | 5.24 ∠-41.4 | -8° |
| STATE | 1 | 0 | 0 | 4.63 ∠-48.4 | -15° |

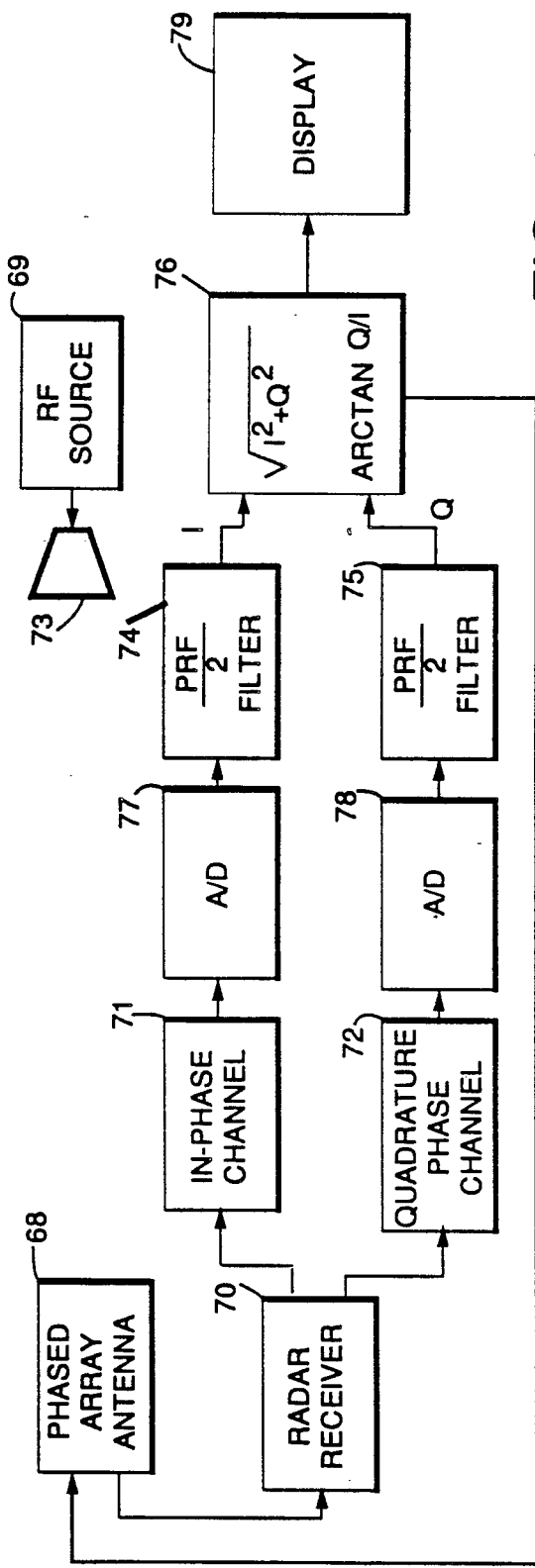
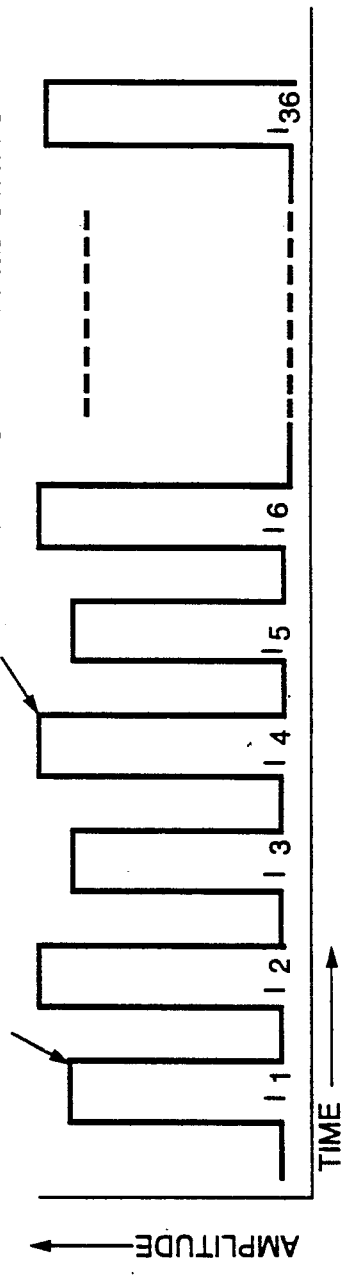
FIG. 4.
FIG. 7.

METHOD AND APPARATUS FOR TESTING PHASE SHIFTER MODULES OF A PHASED ARRAY ANTENNA

BACKGROUND

The present invention relates to phased array antennas and, more particularly, to a method and apparatus for testing phased array antennas having a plurality of controllable phase shifters on a plurality of subarray module circuit boards.

There exists a type of radar antenna that employs a plurality of subarray module circuit boards mounted in a matrix configuration. Each subarray module circuit board comprises a plurality of radiating dipole antenna elements, a plurality of power dividers, a four-bit phase shifter and a plurality of subarray steering bit networks. Such radar antennas may be used, for example, on the AN/TPQ-37 Firefinder Radar, the Project 548 Air Defense Radar, or the like.

In this type of radar antenna, control circuits for the subarray steering bits of all of the subarray module circuit boards are connected together so that there is no individual control. Consequently, it is very difficult to test the individual subarray steering bits. Typically, testing requires disconnection of the antenna array from the radar system, and disassembly of the radar antenna to perform individual tests on each of the subarray module circuit boards. This means that the testing cannot be performed in the field.

Alternatively, a diagnostic run is made using a near field probe technique. Such a near field probe technique is described in a paper entitled "Near-Field Probe Used As A Diagnostic Tool To Locate Defective Elements In An Array Antenna". The authors are J. J. Lee, Edward M. Ferren, D. Pat Woollen and Kuan M. Lee. The paper was published in the IEEE Transactions on Antennas and Propagation, Vol 36, No. 6, June 1988. In a near field probe, a radio frequency probe moves across a row of dipoles and measures the amplitude and phase response at each position. Due to the close proximity of the array elements, the probe interacts with array elements and causes multiple reflections. As a result, the mismatch of the probe varies from point to point, leading to phase variations as high as 60°. FIG. 5 on page 887 of the above technical paper illustrates these phase variations as high as 60°. The near field probe technique does not provide a good test of the type of subarray module circuit boards under consideration here because the sizes of subarray steering bit phase changes are only 25° or 50°. Since the phase variation of the near field probe technique can be as much as 60°, its use can lead to diagnostic errors.

It is an objective of the present invention to provide a method and apparatus for testing all of the subarray steering bits of a radar phased array antenna while the radar is in the field. Another objective of the invention is the provision of a method and apparatus to perform radio frequency tests on all phase shifters of a phased array antenna without disassembling it from a radar system. A further objective of the present invention is to provide a method to isolate radio frequency faults of subarray steering bits without using an expensive near field probe. A still further objective of the invention is the provision of a method for testing subarray steering bits that cannot be tested using current phase toggling techniques.

SUMMARY OF THE INVENTION

The present invention is a method and apparatus for performing a radio frequency test on all the subarray steering bits which are not individually controllable while the radar is in the field. In other words, this radio frequency phase measurement method and apparatus permits isolating subarray steering bit faults while the phased array antenna is integrated with a radar system. The present invention utilizes the phase information, contained in the output of in-phase (I) and quadrature phase (Q) channels of the radar system, for subarray steering bit fault isolation. First, the subarray steering bits are set to a reference state and the 180° bit of the subarray under test is toggled so that the radio frequency information of this particular subarray can be extracted from the noise floor. After the first phase measurement, one of the subarray steering bits is switched and the 180° bit of the same subarray under test is toggled again. Then, the second phase measurement is made. The phase difference between these two phase measurements which can be calculated from the filtered I and Q channel outputs, is used to detect the subarray steering bit fault of the subarray under test. The present invention uses the phase information of the I and Q channel outputs which has not been used for this purpose before. This in-system test method permits the performance of a complete phased array antenna BITE (Built-In-Test-Equipment) test while the antenna is still integrated with a radar system.

Apparatus provided in accordance with the present invention includes a multi-element feed for illuminating the subarray modules under test. The phased array antenna under test comprises a plurality of subarray modules arrayed in a matrix of columns and rows. In accordance with the present invention, a source of radio frequency test signal is coupled to a multi-element feed comprising a plurality of dipoles mounted on a mast. Each dipole has a radiation pattern wide enough to cover two rows of subarray modules. For example, if the phased array antenna has ten rows of subarray modules, the multi-element feed has five dipoles. The radio frequency test signal is switched to the particular dipole which illuminates the row of the subarray module under test.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 4 is a block diagram of a test set up for testing the subarray module of FIG. 1 while installed in a phased array antenna that is integrated with a radar system;

FIG. 7 is a graph plotted with time along the abscissa of the signal amplitude of the in-phase channel of the test set up of FIG. 4.

DETAILED DESCRIPTION

Figures 1, 2, 3:
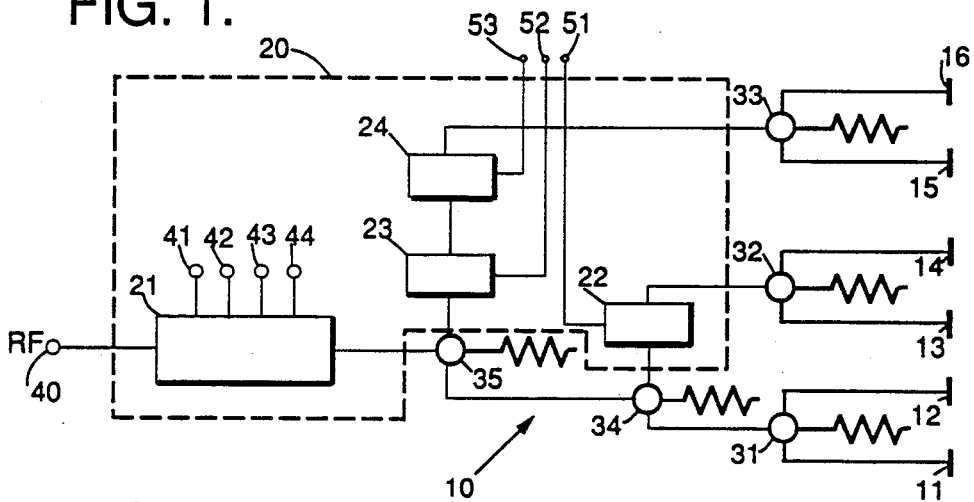
FIG. 1 is a schematic diagram of a typical phase shifter module of the type that may be tested in accordance with the principles of the present invention.
FIG. 2 is a table showing the relative phase shift among six radiating dipole elements in the phase shifter module of FIG. 1.
FIG. 3 is a table showing the amplitude and phase values of the combined signal for three different subarray steering bit settings in the phase shifter module of FIG. 1.

Referring now to the drawings, FIG. 1 is a schematic diagram of a subarray module 10 for use in a radar antenna that may employ typically 359 such subarray modules 10 mounted in a matrix configuration. Radar antennas of this type typically may be used, for example, on the AN/TPQ-37 Firefinder Radar, the Project 548 Air Defense Radar, or the like. It is to be clearly understood that the principles of the present invention are not limited to those particular radars which are mentioned by way of illustration and explanation only. Phased array antenna systems of the type used in the AN/TPQ-37 and Project 548 radars utilize what are referred to as "subarray steering bits" to suppress grating lobes which are typically caused by the sharing of one phase shifter among six dipoles. Because the subarray steering bits of all subarray modules 10 in the antenna are always set to the same bias state, the subarray steering bits cannot be individually controlled. As a result the RF (radio frequency) probe technique called "the phase toggling technique" can be used to test only what are referred to as "main phase bits". Hence, prior methods of making phase shifter RF tests in the field have not been available for use with the above mentioned radars.

Referring again to the schematic diagram of FIG. 1, the current AN/TPQ-37 radar antenna system comprises a number of subarray modules 10. Each of the subarray modules 10 comprises six radiating dipole elements 11, 12, 13, 14, 15, 16 and a seven-bit phase shifter 20, of which four bits are main phase bits and three bits are subarray steering bits. More specifically, the seven bit phase shifter 20 comprises a four bit phase shifter 21 which provides the four main phase bits, and first, second and third subarray steering bit networks 22, 23, 24 which provide the three subarray steering bits. Three out of the seven or 43%, are not testable by the conventionally used phase toggling technique.

The first and second dipole elements 11, 12 are coupled to a first power divider 31, the third and fourth dipole elements 13, 14 are coupled to a second power divider 32 and the fifth and sixth dipole elements 15, 16 are coupled to a third power divider 33. The first power divider 31 is coupled to one side of a fourth power divider 34. The second power divider 32 is coupled by way of the first subarray steering bit network 22 to the other side of the fourth power divider 34. The fourth power divider 34 is coupled to one side of a fifth power divider 35. The third power divider 33 is coupled by way of the second and third subarray steering bit networks 23, 24 to the other side of the fifth power divider 35. The fifth power divider 35 is coupled by way of the four bit phase shifter 21 to an RF terminal 40 of the subarray module 10. When the phased array antenna is operating in receive mode, the combined output of the six dipole elements 11, 12, 13, 14, 15, 16 appears at the RF terminal 40.

The four main phase bits are controlled by four digital signal lines that apply binary signals to four control terminals 41, 42, 43, 44 of the four bit phase shifter 21. When the first terminal 41 is toggled between zero and one, the four bit phase shifter 21 toggles between 0° and 180°. When the second terminal 42 is toggled between zero and one, the four bit phase shifter 21 toggles between 0° and 90°. When the third terminal 43 is toggled between zero and one, the four bit phase shifter 21 toggles between 0° and 45°. When the fourth terminal 44 is toggled between zero and one, the four bit phase shifter 21 toggles between 0° and 22.5°. These are the four main phase bits: 180°, 90°, 45° and 22.5°.

The three subarray steering bits are controlled by three digital signal lines that apply binary signals to three subarray steering bit control terminals 51, 52, 53. The first subarray steering bit control terminal 51 controls the first subarray steering bit network 22; the second subarray steering bit control terminal 52 controls the second subarray steering bit network 23; and the third subarray steering bit control terminal 53 controls the third subarray steering bit network 24. When the first subarray steering bit control terminal 51 is toggled between zero and one, the first subarray steering bit network 22 toggles between 0° and 25°. When the second subarray steering bit control terminal 52 is toggled between zero and one, the second subarray steering bit network 23 toggles between 0° and 25°. When the third subarray steering bit control terminal 53 toggles between zero and one, the third subarray steering bit network 24 toggles between 0° and 50°. These are the three subarray steering bits: 25°, 25° and 50°. It should be clearly understood that when the phased array antenna is fully assembled, all of the 359 subarray modules 10 have their three subarray steering bit control terminals 51, 52, 53 tied together so that each of the three subarray steering bits may be individually toggled in unison on all of the 359 subarray modules 10. The amplitude and phase of the combined signal that appears at the RF terminal 40 when using the six radiating dipole elements 11, 12, 13, 14, 15, 16, can be calculated using the equation: vector sum $= e^{j\theta 1} + e^{j\theta 2} + e^{j\theta 3} + e^{j\theta 4} + e^{j\theta 5} + e^{j\theta 6}$, where $\theta 1, \theta 2, \ldots \theta 6$ represent the phase shift through each path.

FIG. 2 is a table showing the phase relationship between the dipole elements 11, 12, 13, 14, 15, 16 when the subarray steering bits are set in four states. The left hand column lists state 0, 1, 2 and 4. The next three columns list the binary signal applied to the three subarray bit control terminals 51, 52, 53. The last six columns indicate the phasing of the six dipole elements 11, 12, 13, 14, 15, 16, with the first dipole element 11 being used as a reference at 0°. In state 0, all three subarray bit control terminals 51, 52, 53 are set to zero, and the dipole elements 11, 12, 13, 14, 15, 16 are phased, respectively, as follows: 0°, −20° −27.5°, −47.5°, −42.5°, −62.5°. In state 1, the first subarray bit control terminal 51 is set to one, and the others are set to zero. The dipole elements 11, 12, 13, 14, 15, 16 are phased, respectively, as follows: 0°, −20° −52.5°, −72.5°, −42.5°, −62.5°. In state 2, the second subarray bit control terminal 52 is set to one, and the others are set to zero. The dipole elements 11, 12, 13, 14, 15, 16 are, respectively: 0°, −20°, −27.5°, −47.5°, −67.5°, −87.5°. There is no state 3. In state 4, the third subarray bit control terminal 53 is set to one, and the others are set to zero. The dipole elements 11, 12, 13, 14, 15, 16 are: 0°, −20° −27.5°, −47.5°, −92.5°, −112.5°.

Different subarray steering bit settings result in different phase values of the combined signal that appears at the RF terminal 40. FIG. 3 is a table showing the amplitude and phase values of the combined signal at the RF terminal 40 for four different subarray steering bit settings. These amplitude and phase values occur when the antenna is illuminated by an external RF source located broadside thereto. In the table of FIG. 3, the states and the setting of the subarray steering bits corresponds to the table of FIG. 2. The amplitude and phase of the combined signal at the RF terminal 40 is listed in the third columns for state 0, 1, 2 and 4. The phase at state 0 is taken as a reference. The fourth column of FIG. 3 lists the phase shift for each state. State 0 is 0° because it is the reference. State 1 is −8.6° because that is the difference between −42.0° and −33.4°. State 2 is −8° because that is the difference between −41.4° and −33.4°. State 4 is −15° because that is the difference between −48.4° and −33.4°. FIG. 3 shows an 8° phase shift for switching a 25° subarray steering bit, and a 15° phase shift for switching a 50° subarray steering bit. It should be noted that a good subarray module 10 under test should demonstrate an 8° phase shift or a 15° phase shift when a subarray steering bit is switched. A faulty subarray module 10 under test shows no phase shift when a subarray steering bit is switched.

It is a feature of the present invention to detect whether switching a subarray steering bit produces the correct phase difference of 8° or 15°, depending on the bit size. If one subarray steering bit is not functional, then the entire subarray module 10 is replaced. The test of the present invention is performed twice on each of the three subarray steering bits on each subarray module 10 to obtain the phase difference between two states. This results in a total of 6×359 tests for a complete phased array antenna having 359 subarray modules 10.

Figure 5:
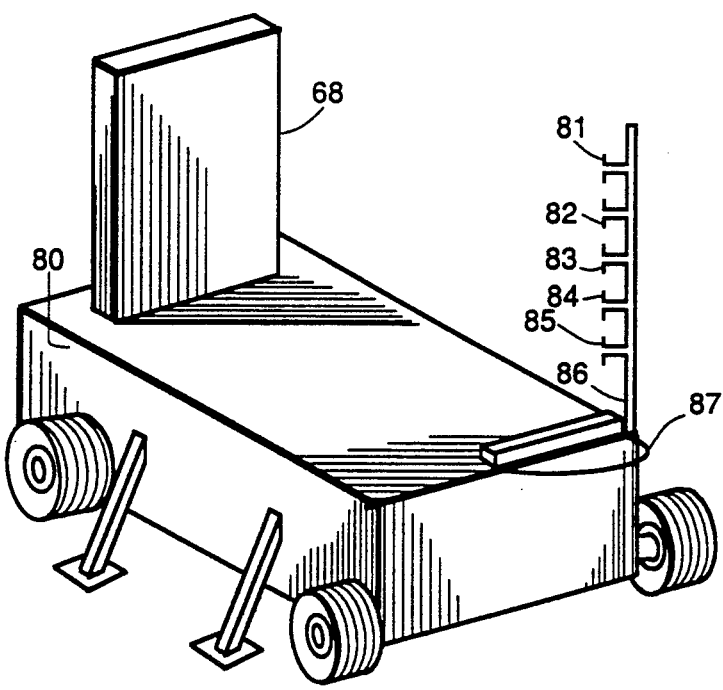
FIG. 5 is a perspective view of a multi-element feed test source comprising five external dipoles mounted to a mast on an antenna trailer of a radar system.
Figure 6:
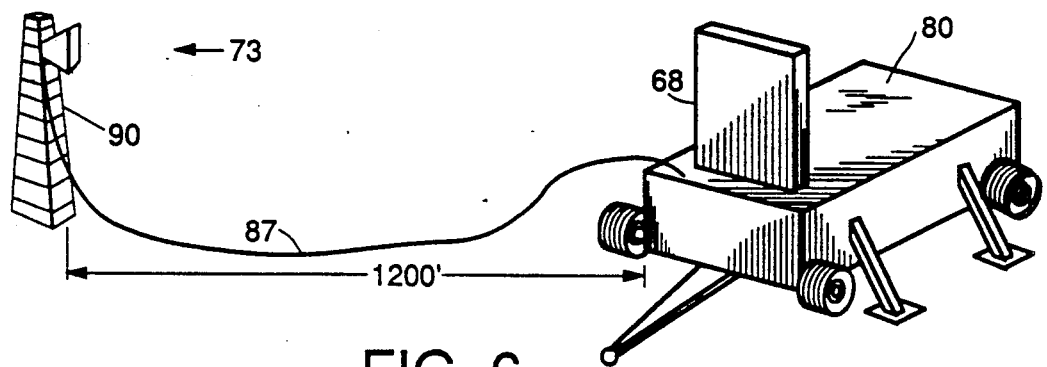
FIG. 6 is a perspective view of a test source mounted on a tower track to illuminate a phased array antenna mounted on an antenna trailer.

FIG. 4 is a block diagram of an exemplary hardware test set-up for the test method of the present invention. The RF terminal 40 of a phased array antenna 68 comprising a plurality of subarray modules 10 is coupled into a radar receiver 70 where the signals are processed in an in-phase channel 71 and a quadrature phase channel 72. The output of the in-phase and quadrature phase channels 71, 72 is converted from analog to digital signals through A/D (Analog-to Digital) converters 77, 78. The test method of the present invention uses the phase information of the in-phase and quadrature phase channels 71, 72. The amplitude and phase of the combined signals at the RF terminal 40 of the antenna 68 are calculated using the digital signals out of the I and Q A/D converters 77, 78. First the output signals are filtered in PRF/2 filter units 74, 75, by using a computer software algorithm that is discussed hereinafter. Then the amplitude is calculated in a digital signal processor 76 by taking the square root of the sum of $I^2$ plus $Q^2$. Then the phase is calculated by taking the arctangent of Q divided by I. The results of the test are presented on a display 79 which may include a cathode ray tube monitor or a printout. The phased array antenna 68 can be tested while integrated with a radar system. The only modification to the radar system is to add an external radiating element test source 73 which can be either a horn or dipole, and a RF cable. The external radiating element test source 73 can be connected to an existing RF source 69 which may comprise the drive output of a radar transmitter RF up-converter or the output from a radar transmitter first RF amplifier, depending on the distance of the radiating element test source 73 to the antenna 68. Referring now to FIG. 5, this external radiating element test source 73 can be mounted on the far corner of an antenna trailer 80 and the antenna 68 can be trained toward the external radiating element test source 73. A multi-element type of radiating element test source 73 comprises in the present example, five dipoles 81, 82, 83, 84, 85, a mast 86 and a RF cable 87. Each of the dipoles 81, 82, 83, 84, 85 has a radiation pattern wide enough to cover two rows of subarray modules 10. If the antenna 68 were to have more or less than ten rows, the number of dipoles 81, 82, 83, 84, 85 that would be used would be more or less than five. The RF signal is switched to one of the dipoles 81, 82, 83, 84, 85 which illuminates the row of the subarray module 10 under test. The radiating element test source 73 is installed at the corner of the trailer 80 as shown in FIG. 5 or the radiating element test source 73 may be mounted on a tower track 90 as shown in FIG. 6, if one is available.

It is a feature of the present invention that in order to pick up the phase information of the subarray module 10 under test, the digital signal processor 76 toggles the 180° bit of the main phase bits of the module 10 under test and leaves the other modules 10 unchanged such that signals from other subarray modules 10 can be cancelled by a simple Doppler filter as described in Chapter 18 of "Introduction to Airborne Radar" by G. W. Stimson, Hughes Aircraft Company, 1983. After the filtering in the PRF/2 filter units 74, 75, the outputs from the in-phase and quadrature-phase channels 71, 72 are recorded and used to calculate the phase shift. By using this phase toggling method twice, once with a subarray steering bit forward biased and another with the same subarray steering bit reverse biased, the phase difference can be extracted from the measurements. Hence, a subarray steering bit RF fault can be detected by comparing the phase difference with a threshold.

Once the hardware is connected, a 180° phase bit toggling with subarray steering bit forward or reverse biased is used to generate a pseudo Doppler (PRF/2) test target as the input test source. A pseudo Doppler test target is created by commanding a normal system test target for any even number of pulses, say 36 pulses, and having the 180° phase bit of the subarray module 10 under test enabled only on alternating pulses. FIG. 7 is a graph of the signal amplitude of the output of the in-phase channel 71 plotted with time along the abscissa. The graph of FIG. 7 shows how the signal amplitude varies as the 180° bit is toggled for each of the 36 pulses. This technique collects the resultant signal processor I and Q data of each pulse as the input sample of a PRF/2 software Doppler filter algorithm. The algorithm of the in-phase channel PRF/2 filter 74 is equal to the following: $Iout = I_1 - I_2 + I_3 - I_4 + I_5 - I_6 + \ldots - I_{36}$. The algorithm of the quadrature channel PRF/2 filter 75 is equal to the following: $Qout = Q_1 - Q_2 + Q_3 - Q_4 + Q_5 - Q_6 + \ldots - Q_{36}$. The software Doppler filter response of the 36 phase samples discriminates all but the pseudo Doppler target which was modulated by the 180° phase bit of the subarray module 10 under test. In this manner, the RF amplitude and phase of the combined signal at the RF terminal 40 of the subarray module 10 under test are collected. Then, by comparing the phases of the RF signals of two cases, one with a subarray steering bit in reverse state and another with the same subarray steering bit in forward state, the RF performance of the subarray steering bit of the test subarray module 10 can be determined.

Figure 8A:
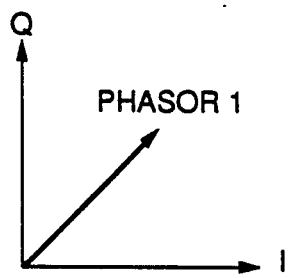
FIG. 8a, FIG. 8b and FIG. 8c are three phasor diagrams of the combined signal after PRF/2 software filtering illustrating the phase shift between two phasors due to the switching of one subarray steering bit.
Figure 8B:
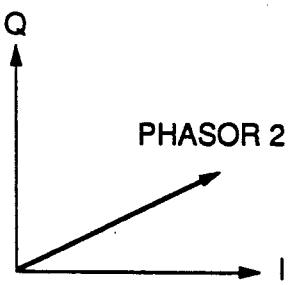
Figure 8C:
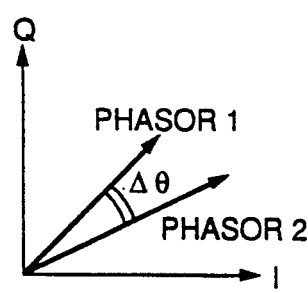

A phasor diagram can be used to explain how this invention works. The filtered output of the first or second phase toggling measurement can be described as a vector phasor 1 or phasor 2 in space as shown in FIGS. 8a, 8b, and 8c. FIG. 8a shows one subarray steering bit in reverse bias state. FIG. 8b shows one subarray bit in forward bias state. The phasor diagram of FIG. 8c shows the combined signal after PRF/2 software filtering, and indicates the phase shift $\Delta \theta$ between two phasors due to the switching of one subarray steering bit. The filtered output of the second phase toggling measurement is lagging by either 8° or 15° for a 25° or a 50° subarray steering bit respectively, if the subarray bit is functional. If the subarray bit is not working, then the two cases are identical and hence there is no phase shift between the two vectors. By using the experimental data from other field tests of radar systems, the phase measurement accuracy for this invention is estimated to be $\pm 0.975°$. The phase measurement is accurate enough to detect a subarray steering bit RF fault which changes phase shift by either 8° or 15° depending on the bit size.

The present invention enables the RF tests of subarray steering bits which account for 43% of the phase bits. This invention nearly doubles the capability of the RF test on phase bits. This invention can be used to perform a complete phase shifter RF BITE function at depot or in the field without the disassembly of antenna. Hence, a significant cost savings for antenna maintenance and for shipping radars back to the depot can be realized by this invention.

The present invention has the following advantages: (1) it can perform RF tests on all phase shifter bits of a phased array antenna without tearing it down from a radar system; (2) it can isolate RF faults of subarray steering bits without using an expensive near field probe; (3) it can be implemented in the field to determine the condition of a phased array antenna; and (4) it can test subarray steering bits which cannot be tested using current phase toggling techniques. The advantages of this invention over the near field probe diagnostic technique are: (1) the test source of this invention is in the far field so that multiple reflections due to interaction between array elements and test probe will not occur; (2) the expensive near field probe facility is not needed; and (3) the RF tests of the antenna can be performed without removing the antenna from the radar system.

Thus there has been described a new and improved RF phase measurement technique for isolating subarray steering bit faults in a phased array antenna while it is integrated with a radar system. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A method for testing a phased array radar antenna having a plurality of subarray steering bit networks that provide subarray steering bits in unison in response to binary digital signals but that cannot be individually controlled, said method comprising the following steps:
   illuminating the phased array radar antenna with a radio frequency test signal;
   setting the binary digital signals that control subarray steering bits to a reference setting;
   toggling the 180° bit of the main phase bits of a subarray module under test between 0° and 180°;
   selecting the output of the subarray module under test by employing a predetermined filter;
   setting the binary digital signals that control subarray steering bits to a second setting;
   toggling the 180° bit of the main phase bits of the subarray module under test between 0° and 180°;
   selecting the output of the subarray module under test by employing a predetermined filter; and
   calculating the phase difference from the reference setting to the second setting and comparing it with a threshold.

2. The method of claim 1 which further comprises the step of recording the inphase and quadrature phase channel outputs from the radar receiver for each setting.

3. The method of claim 1 wherein each step of selecting the output of the subarray module comprises the step of selecting the output of the subarray module under test by employing Doppler filtering.

4. The method of claim 1 wherein each step of selecting the output of the subarray module comprises the step of selecting the output of the subarray module under test by employing a predetermined software filtering.

5. The method of claim 1 wherein each step of selecting the output of the subarray module comprises the step of selecting the output of the subarray module under test by employing a Doppler filter type of software filtering.

6. A method for testing a phased array radar antenna having a plurality of subarray steering bit networks that provide subarray steering bits in unison in response to binary digital signals but cannot be individually controlled, said method comprising the following steps:
   illuminating the phased array radar antenna with a radio frequency test signal;
   setting the binary digital signals that control subarray steering bits to a reference setting;
   toggling the 180° bit of the main phase bits of a subarray module under test between 0° and 180°;
   selecting the output of the subarray module under test by employing a Doppler filter type of software filtering;
   recording the in-phase and quadrature phase channel outputs from the radar receiver;
   setting the binary digital signals that control subarray steering bits to a second setting;
   toggling the 180° bit of the main phase bits of the subarray module under test between 0° and 180°;
   selecting the output of the subarray module under test by employing a Doppler filter type of software filtering;
   recording the in-phase and quadrature phase channel outputs from the radar receiver; and
   calculating the phase difference from the reference setting to the second setting and comparing it with a threshold.

7. Apparatus for testing subarray modules of a phased array antenna while it is integrated in a radar system comprising:

a phased array antenna comprising a plurality of subarray modules arrayed in a matrix pattern of rows and columns;

a radio frequency receiver coupled to said antenna for indicating the response of said subarray modules when illuminated with radio frequency energy;

a test source of radio frequency energy;

a multi-element feed comprising multiple dipoles coupled to said test source of radio frequency energy, and wherein said multi-element feed is disposed adjacent said phased array and having said phased array antenna aimed toward said multi-element feed, each dipole of said multi-element feed having a radiation pattern wide enough to cover two rows of said plurality of subarray modules, and wherein the test source is switchable to the particular one of said dipoles that illuminates the particular row of a particular one of said plurality of subarray modules that is under test.

8. The apparatus of claim 7 wherein said multi-element feed further comprises a mast and an RF cable coupled to said test source of radio frequency energy.

9. The apparatus of claim 7 wherein the phased array antenna has a plurality of subarray steering bit networks that provide subarray steering bits in unison in response to binary digital signals but that cannot be individually controlled.

10. The apparatus of claim 9 wherein the phased array antenna that is testable by:

illuminating the phased array antenna with a radio frequency test signal;

setting the binary digital signals that control subarray steering bits to a reference setting;

toggling the 180° bit of the main phase bits of a subarray module under test between 0° and 180°;

selecting the output of the subarray module under test by employing a predetermined filter;

setting the binary digital signals that control subarray steering bits to a second setting;

toggling the 180° bit of the main phase bits of the subarray module under test between 0° and 180°;

selecting the output of the subarray module under test by employing a predetermined filter; and calculating the phase difference from the reference setting to the second setting and comparing it with a threshold.

11. The apparatus of claim 10 wherein the phased array antenna is further testable by recording the in-phase and quadrature phase channel outputs from the radar receiver for each setting.

12. The apparatus of claim 10 wherein the phased array antenna is further testable by selecting the output of the subarray module under test by employing Doppler filtering.

13. The apparatus of claim 10 wherein the phased array antenna is further testable by selecting the output of the subarray module under test by employing a predetermined software filtering.

14. The apparatus of claim 10 wherein the phased array antenna is further testable by selecting the output of the subarray module under test by employing a Doppler filter type of software filtering.

* * * * *